United States Patent
Luo et al.

(10) Patent No.: US 9,685,757 B2
(45) Date of Patent: Jun. 20, 2017

(54) SYSTEM, METHOD AND FIXTURE FOR PERFORMING BOTH OPTICAL POWER AND WAVELENGTH MEASUREMENTS OF LIGHT EMITTED FROM A LASER DIODE

(71) Applicant: Applied Optoelectronics, Inc., Sugar Land, TX (US)

(72) Inventors: Guipeng Luo, Pearland, TX (US); Klaus Alexander Anselm, Sugar Land, TX (US); Hung-Lun Chang, Sugar Land, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 27 days.

(21) Appl. No.: 14/588,608

(22) Filed: Jan. 2, 2015

(65) Prior Publication Data
US 2016/0197453 A1 Jul. 7, 2016

(51) Int. Cl.
*G01J 1/42* (2006.01)
*H01S 5/00* (2006.01)
*G01J 1/04* (2006.01)

(52) U.S. Cl.
CPC .......... *H01S 5/0014* (2013.01); *G01J 1/0411* (2013.01); *G01J 1/0451* (2013.01); *G01J 1/4257* (2013.01)

(58) Field of Classification Search
CPC ....... G01J 2001/4247; G01J 2001/4252; G01J 2001/1636
See application file for complete search history.

(56) References Cited

U.S. PATENT DOCUMENTS

| | | | |
|---|---|---|---|
| 7,626,688 B2 * | 12/2009 | Ou | G01J 1/02 250/226 |
| 2002/0097760 A1 * | 7/2002 | May | G01J 3/02 372/18 |

(Continued)

OTHER PUBLICATIONS

Shanghai Grandway Telecom Tech. Co., Ltd, "OPM Series High Precision Optical Power Testing Module", printed Aug. 10, 2016, http://en.grandway.com.cn/products/products_4/GJ800_Multi_channel_Passive_De/, pp. 1 and 2.*

(Continued)

*Primary Examiner* — Kara E Geisel
*Assistant Examiner* — Shawn Decenzo
(74) *Attorney, Agent, or Firm* — Grossman Tucker Perreault & Pfleger, PLLC; Norman S. Kinsella

(57) ABSTRACT

A dual testing system and method is used to perform both optical power and wavelength measurements on laser light emitted from a laser diode, such as a chip-on-submount (COS) laser diode or a laser diode in a bar laser. A testing fixture may be used to facilitate both measurements by simultaneously detecting the light for performing a first test including the optical power measurement(s) and reflecting the light for performing a second test including the wavelength measurement(s). The testing fixture may include an angled photodetector and an optical coupling system such as a collimating lens, a focal lens and an optical waveguide. The testing fixture may be electrically connected to an optical power testing module, such as a light-current-voltage (LIV) testing module, for performing the optical power measurement(s) and may be optically coupled to a wavelength measurement module, such as an optical spectrum analyzer (OSA) for performing the wavelength measurement(s).

25 Claims, 6 Drawing Sheets

(56) References Cited

U.S. PATENT DOCUMENTS

| | | | |
|---|---|---|---|
| 2002/0103439 A1* | 8/2002 | Zeng | G01J 3/0289 |
| | | | 600/476 |
| 2004/0136423 A1* | 7/2004 | Coldren | B82Y 20/00 |
| | | | 372/38.02 |
| 2005/0128469 A1* | 6/2005 | Hall | G01N 21/21 |
| | | | 356/237.1 |
| 2010/0177793 A1* | 7/2010 | Rossi | H01S 5/141 |
| | | | 372/20 |
| 2012/0268743 A1* | 10/2012 | Wang | H01S 5/0042 |
| | | | 356/417 |
| 2015/0069565 A1* | 3/2015 | Na | H01L 31/02363 |
| | | | 257/436 |

OTHER PUBLICATIONS

Tektronix, "Keithley Optical SourceMEter Instruments", printed Aug. 10, 2016, http://www.tek.com/keithley-source-measure-units/keithley-optical-sourcemeter-instruments, pp. 1 and 2.*

* cited by examiner

SYSTEM, METHOD AND FIXTURE FOR PERFORMING BOTH OPTICAL POWER AND WAVELENGTH MEASUREMENTS OF LIGHT EMITTED FROM A LASER DIODE

TECHNICAL FIELD

The present disclosure relates to testing and/or measuring parameters of laser diodes, and in particular, relates to performing both optical power and wavelength measurements of a laser diode.

BACKGROUND INFORMATION

Various types of semiconductor laser diodes are used in a variety of industrial and scientific applications. A distributed feedback (DFB) laser, for example, is one type of laser diode where the active region of the device is periodically structured as a diffraction grating to provide lasing at a particular wavelength or range of wavelengths. Lasers diodes, such as DFB lasers, may be used, for example, in optical transmitters or transceivers for telecommunications applications. In some of these applications, a laser diode chip is mounted on a sub-mount including a substrate with conductive material for providing electrical connections to the laser diode, commonly called a chip-on-submount (COS) package. A COS package may be installed in another package or assembly, such as a butterfly laser package or a transmitter optical subassembly (TOSA). In other applications, a plurality of laser diodes may be formed together as a bar, commonly referred to as a bar laser.

Laser diodes are tested to ensure the operating parameters and overall quality of the laser diodes. These tests are generally performed before assembling the laser diode into another package or assembly during manufacturing. The testing often includes performing optical power measurements such as light-current-voltage measurements and wavelength measurements such as side-mode suppression ratio (SMSR) and peak wavelength measurements. Because of the challenges involved with measuring distinct parameters, such as optical power and wavelength, different testing procedures are performed separately to reliably measure these different parameters. Performing multiple separate testing procedures on each laser diode may slow the manufacturing process, especially when the tests must be performed on each of a number of laser diodes.

BRIEF DESCRIPTION OF THE DRAWINGS

These and other features and advantages will be better understood by reading the following detailed description, taken together with the drawings wherein.

DETAILED DESCRIPTION

A dual testing system and method, consistent with embodiments described herein, is used to perform both optical power and wavelength measurements on laser light emitted from a laser diode, such as a chip-on-submount (COS) laser diode or a laser diode in a bar laser. A testing fixture may be used to facilitate both measurements by simultaneously detecting the laser light for performing a first test including the optical power measurement(s) and reflecting the laser light for performing a second test including the wavelength measurement(s). The testing fixture may include an angled photodetector and an optical coupling system such as a collimating lens, a focal lens and an optical waveguide. The testing fixture may be electrically connected to an optical power testing module, such as a light-current-voltage (LIV) testing module, for performing the optical power measurement(s) and may be optically coupled to a wavelength measurement module, such as an optical spectrum analyzer (OSA) for performing the wavelength measurement(s).

As used herein, "optical power measurement" refers to any measurement that produces a parameter that is representative of or a function of the power of the laser light emitted from a laser diode being tested. As used herein, "wavelength measurement" refers to any measurement that produces a parameter that is representative of or a function of a wavelength or spectrum of wavelengths of the laser light emitted from a laser diode being tested. The term "coupled" as used herein refers to any connection, coupling, link or the like and "optically coupled" refers to coupling such that light from one element is imparted to another element. Such "coupled" devices are not necessarily directly connected to one another and may be separated by intermediate components or devices that may manipulate or modify such signals.

Figure 1:
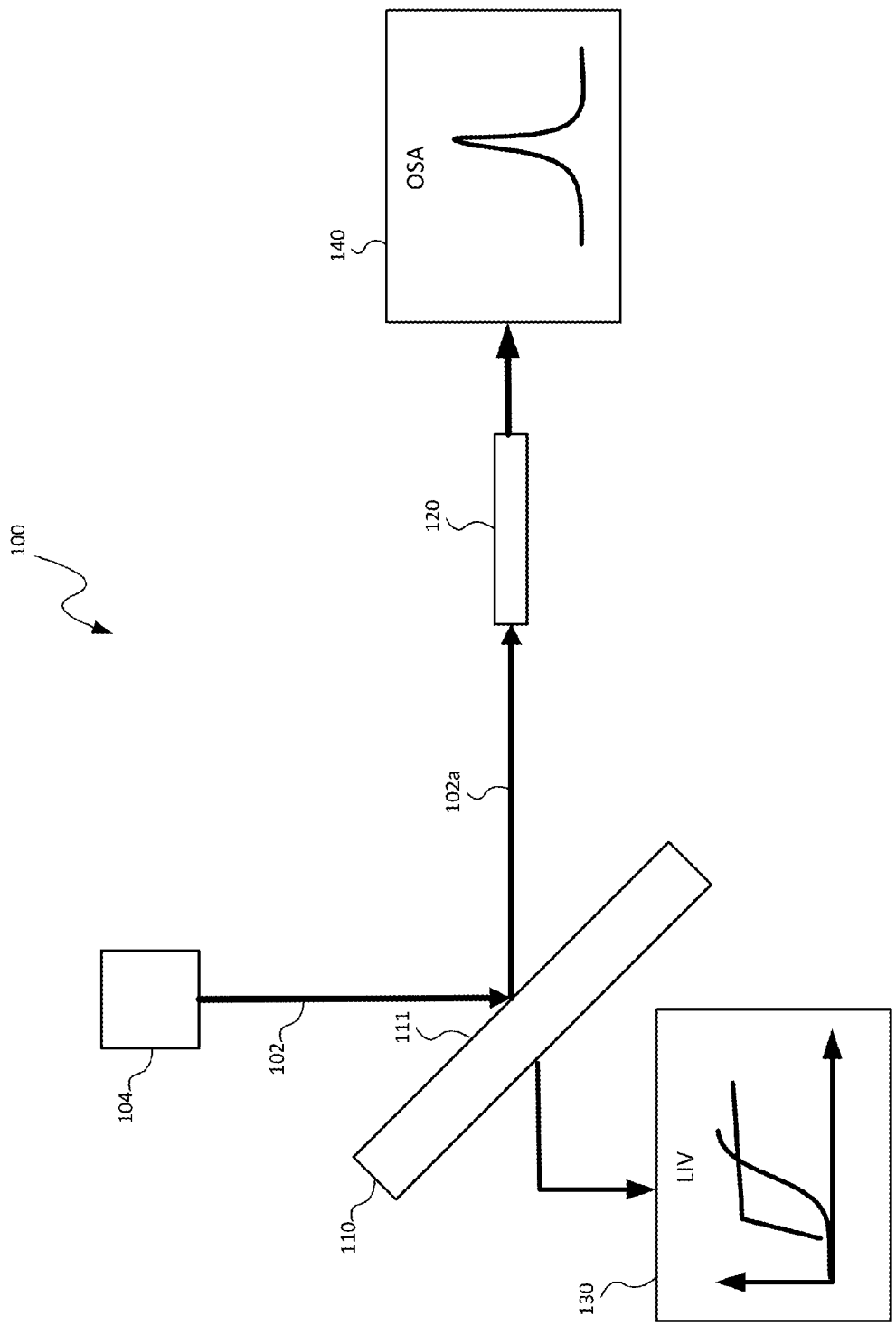
FIG. 1 is a schematic view of a dual testing system for performing both optical power and wavelength measurements of laser light emitted from a laser diode, consistent with embodiments of the present disclosure.

Referring to FIG. 1, a dual testing system 100, consistent with embodiments of the present disclosure, performs both optical power and wavelength measurements on laser light 102 emitted from a laser diode 104 for testing. The dual testing system 100 generally includes a photodetector 110 positioned to receive the laser light 102 on a light receiving surface 111 for simultaneously detecting and reflecting the laser light 102. The dual testing system 100 also includes a waveguide 120 positioned to receive the reflected laser light 102a from the photodetector 110. The dual testing system 100 further includes an optical power testing module 130 electrically connected to the photodetector 110 for performing one or more optical power measurements and a wavelength testing module 140 optically coupled to the optical waveguide 120 for performing one or more wavelength measurements. The dual testing system may also be used to perform other measurements or testing operations in addition to the optical power and wavelength measurements described herein.

The optical power testing module 130 may include, for example, a light-current-voltage (LIV) testing module such as the type known to those skilled in the art for performing optical power measurements. The LIV testing module receives the photodetector current associated with the detected light 102 and may provide laser drive current versus detected light current measurements and/or laser drive voltage versus detected light current measurements. Other types of optical power testing modules and measurements are also within the scope of the present disclosure.

The wavelength testing module 140 may include, for example, an optical spectrum analyzer (OSA) such as the type know to those skilled in the art for performing wavelength measurements. The OSA receives the reflected laser light 102a from the optical waveguide 120 and may provide a side-mode suppression ratio (SMSR) measurement and/or a peak wavelength measurement for the reflected light 102a. The OSA may also display the measured wavelength or spectrum of wavelengths. Other types of wavelength testing modules and wavelength measurements are also within the scope of the present disclosure.

Figure 2:
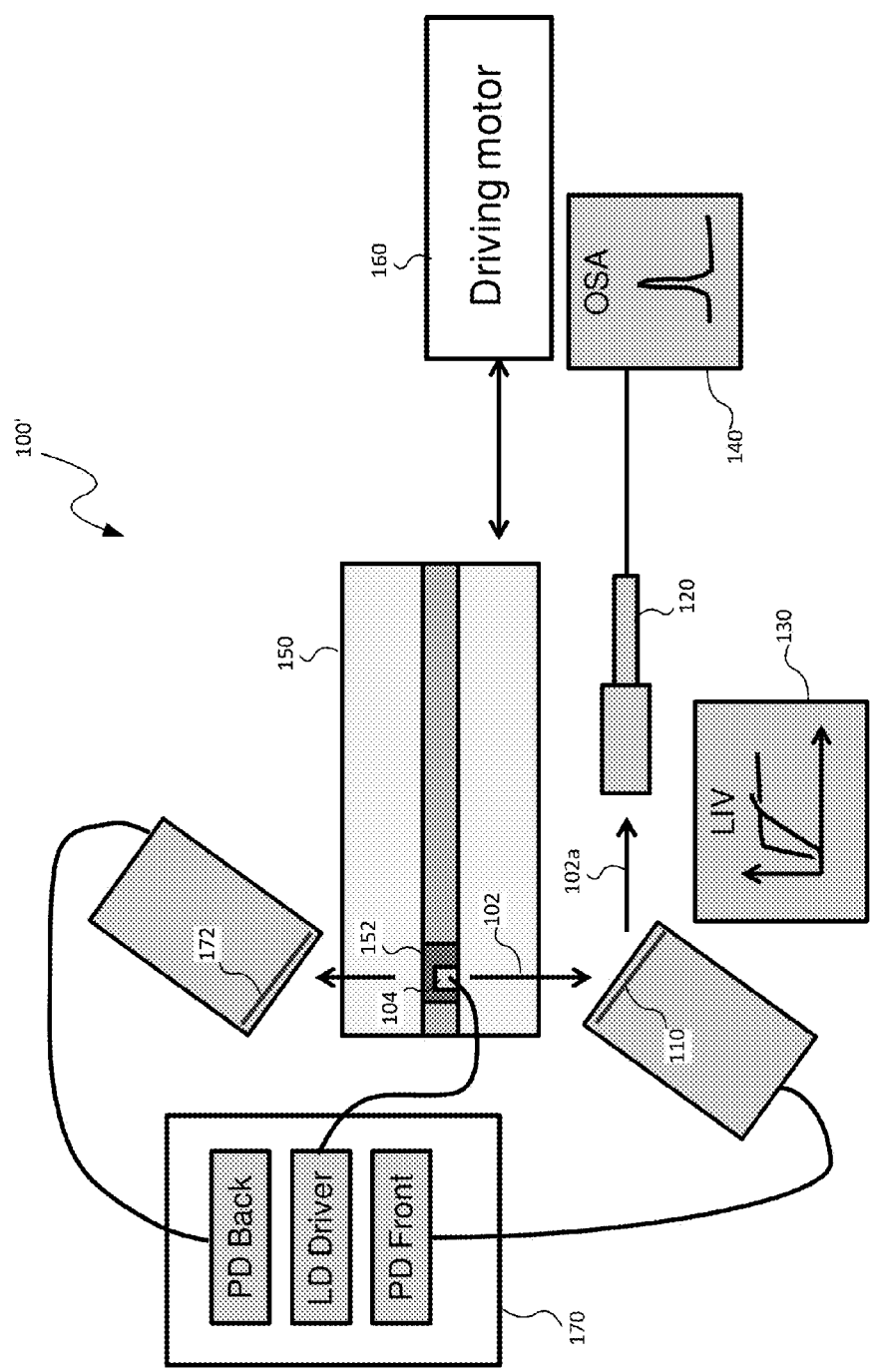
FIG. 2 is a schematic view of an embodiment of a dual testing system for performing both optical power and wavelength measurements of laser light emitted from a laser diode.

FIG. 2 shows another embodiment of a dual testing system 100' in greater detail. In this embodiment, the dual testing system 100' further includes a device under test (DUT) support 150 and a driving mechanism 160 for moving the DUT support 150. The DUT support 150 includes one or more device support regions 152 for supporting one or more laser diodes 104 (only one support region 152 and laser diode 104 are shown in FIG. 2). The DUT support 150 may support, for example, one or more COS laser diodes or a bar laser including a plurality of laser diodes (not shown).

The driving mechanism 160 moves the DUT support 150 to align one of the device support regions 152, and the laser diode 104 supported thereon, such that the laser light 102 emitted from the laser diode 104 is directed at the photodetector 110 for testing. The driving mechanism 160 may provide a linear motion of the DUT support 150 in one or more directions and may include, for example, a driving motor. Where the DUT support 150 includes a plurality of device support regions 152 supporting a plurality of laser diodes 104, the driving mechanism 160 may be used to advance the DUT support 150 to align each of the laser diodes 104 successively for testing. The dual testing system 100' may thus be used to perform batch testing of a plurality of laser diodes 104.

This embodiment of the dual testing system 100' further includes testing circuitry 170 electrically connected to the laser diode 104 and the photodetector 110. The testing circuitry 170 may include laser diode driver circuitry for driving the laser diode 104 with a test signal and photodetector circuitry for receiving the electrical signal from the photodetector 110. The testing circuitry 170 may include any combination of hardware and software known to those skilled in the art for testing laser diodes. The photodetector 110 may thus be electrically connected to the optical power testing module 130 directly or via the testing circuitry 170. The testing circuitry 170 may also be part of the optical power testing module 130. This embodiment of the dual testing system 100' also includes a backside photodetector 172 for detecting laser light emitted from a backside of the laser diode 104, which may also be used for testing.

Figure 3:
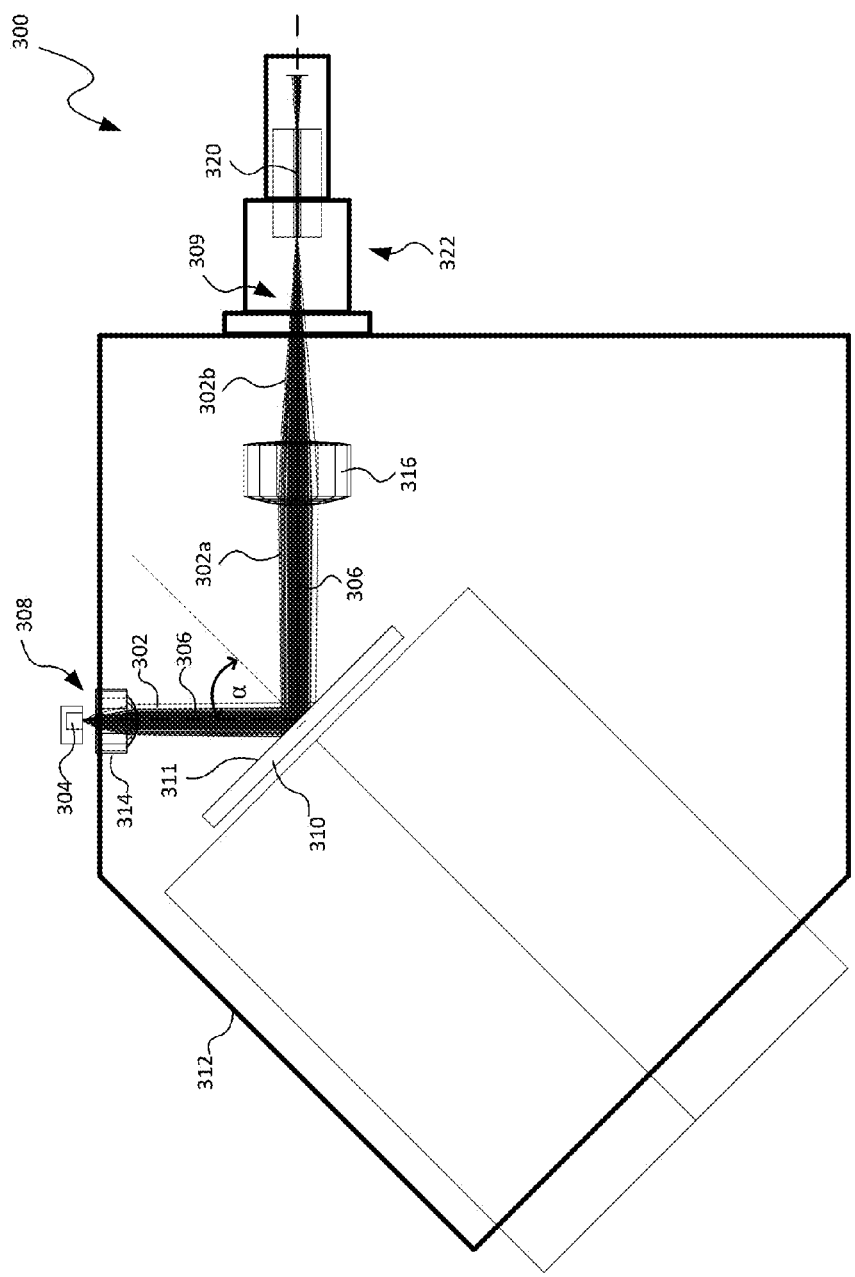
FIG. 3 is a schematic view of an embodiment of a testing fixture for use in a dual testing system, consistent with embodiments of the present disclosure.

Referring to FIG. 3, an embodiment of a testing fixture 300 for use in a dual testing system is shown and described in greater detail. The testing fixture 300 generally includes a fixture body 312 defining an optical path 306 from an optical input 308 to an optical output 309. Laser light 302 emitted from a laser diode 304 aligned with the optical input 308 travels along the optical path 306 for testing. The fixture body 312 supports a photodetector 310 along the optical path 306 such that the laser light 302 is simultaneously detected and reflected for performing both the optical power measurements and the wavelength measurements as described above.

The photodetector 310 is supported by the fixture body 312 with a light receiving surface 311 at an acute angle of incidence a relative to the laser light 302 traveling along the optical path 306. The laser light 302 emitted from the laser diode 304 is thus reflected from the photodetector 310 at an angle and the reflected laser light 302a is directed toward the optical output 309. In the illustrated embodiment, the angle of incidence a is 45° such that the laser light 302 reflects at an angle of 90°, which provides sufficient reflected light 302a and coupling power for the wavelength measurement(s). As described in greater detail below, one example of the photodetector 310 is a germanium-based photodetector that reflects about 10-20% of the light and more specifically about 10% with an AR coating. Other types of photodetectors may also be used and other angles for the photodetector 310 may also be possible.

The testing fixture 300 may also include an optical coupling system to help provide sufficient optical coupling power for the wavelength measurement(s). In the illustrated embodiment, the testing fixture 300 includes a collimating lens 314 at the optical input 306 for collimating the laser light 302 emitted by the laser diode 304 and a focal lens 316 after the photodetector 310 and proximate the optical output 309 for focusing the reflected laser light 302a. The collimating lens 314 directs the collimated light 302 toward the photodetector 310 and the focal lens 316 focuses the reflected light 302a for coupling into an optical waveguide 320 proximate the optical output 309. The collimating lens 314 may include any combination of one or more lenses capable of collimating laser light. The focal lens 316 may include any combination of one or more lenses capable of focusing laser light. The optical waveguide 320 may include one or more segments of optical fiber, such as a multimode optical fiber, or other waveguide structures capable of acting as a transmission medium for laser light. Other lenses, waveguides, or optical components may also be used along the optical path within the testing fixture to facilitate optical coupling of the laser light for the wavelength measurement while also detecting the laser light for the optical power measurement.

The collimating lens 314 and the focal lens 316 are supported by the fixture body 312 in alignment with the optical path 306. In the illustrated embodiment, the fixture body 312 is a housing that supports and encloses the photodetector 310 and lenses 314, 316. The fixture body 312 may also include any other structure (open or closed) capable of supporting the photodetector 310 and lenses 314, 316 and defining the optical path 306. The fixture body 312 may also have other shapes or configurations.

In the illustrated embodiment, the optical waveguide 320 is mounted to the fixture body 312 using an optical connector 322. Although the optical waveguide 320 is shown as being supported outside the fixture body 312 by the optical connector 322, the optical waveguide 320 may also be supported within the fixture body 312 or may extend from inside the fixture body 312 to outside the fixture body 312.

Figure 4A:
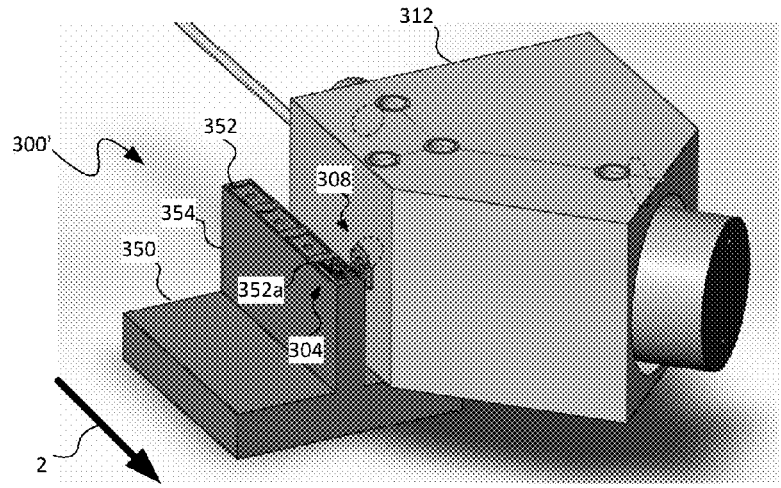
FIGS. 4A-4C are perspective views of another embodiment of a testing fixture for use in a dual testing system, consistent with embodiments of the present disclosure.
Figure 4B:
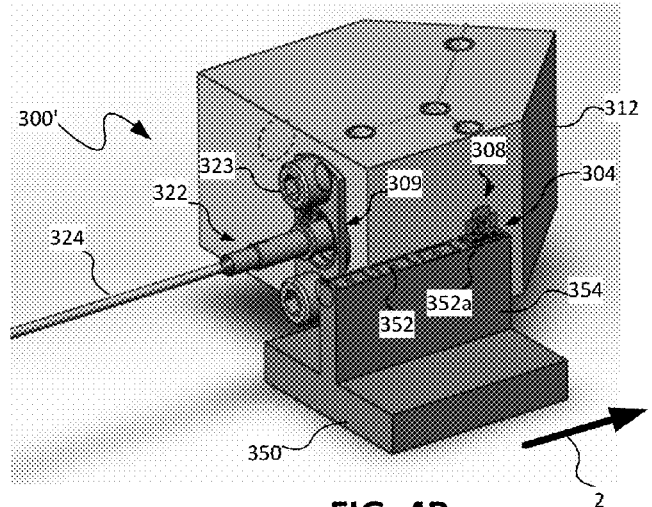
Figure 4C:
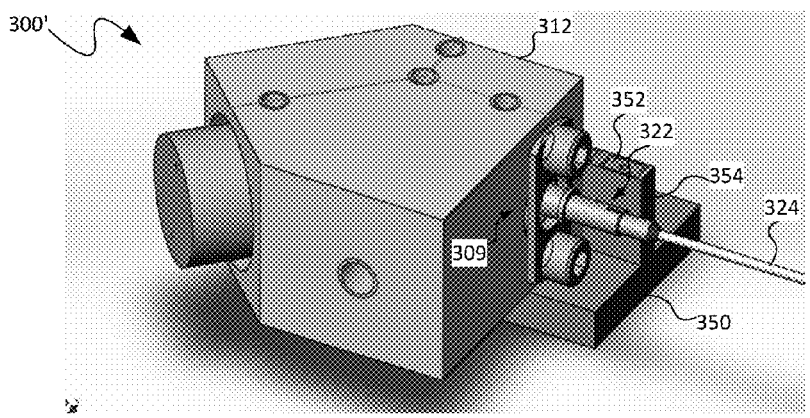

As shown in FIGS. 4A-4C, another embodiment of a testing fixture 300' may also include a DUT support 350 for supporting one or more laser diodes 304 relative to the fixture body 312 and the optical input 308. The DUT support 350 includes a plurality of device support regions 352 located on a raised support strip 354. Other shapes and configurations of the DUT support 350 are also within the scope of the present disclosure. As shown, one of the support regions 352a (and laser diode 304 supported thereon) is aligned with the optical input 308. The DUT support 350 may be moved in the direction of arrow 2 to align each of the support regions 352 (and laser diodes supported thereon) successively. Although the illustrated embodiments show a COS laser diode 304, the testing fixtures 300, 300' may also be used for testing laser diodes within a bar laser. For this testing application, the DUT support 350 may be configured to support a bar laser and may be moved to advance each of the laser diodes in the bar laser into alignment with the optical input 308 of the testing fixture.

FIGS. 4A-4C also illustrate the optical connector 322 optically coupling an optical fiber 324 to the testing fixture 300'. The optical fiber 324 provides optical coupling between the optical waveguide 320 (see FIG. 3) and a wavelength measurement module such as an OSA (not shown). The optical waveguide 320 may be located in the optical connector 322 and/or in the fixture body 312 as discussed above. In one embodiment, the optical waveguide 320 may be one end of the optical fiber 324. The optical connector 322 may be removably fixed to the fixture body 312, for example, using threaded fasteners 323.

Figure 5:
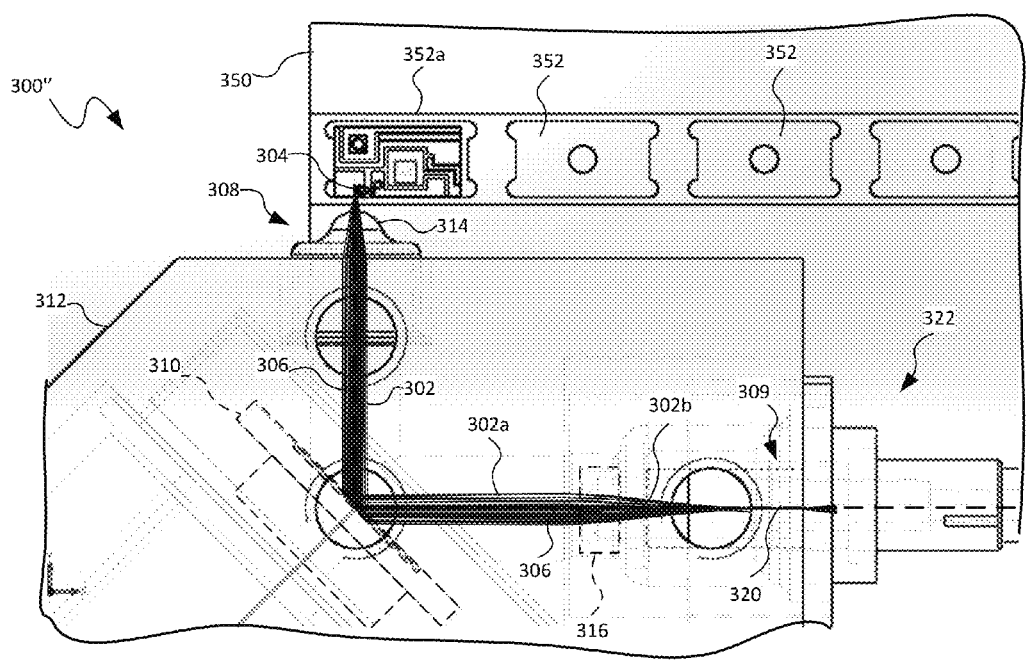
FIG. 5 is a partial plan view of a further embodiment of a testing fixture for use in a dual testing system, consistent with embodiments of the present disclosure.

Another variation of a testing fixture 300" capable of providing the desired optical coupling power is shown in FIG. 5. In this testing fixture 300", the collimating lens 314 includes a ball lens supported by the fixture body 312 at the optical input 308. In other embodiments, the collimating lens may include an aspherical lens or a GRIN (gradient-index) lens. This testing fixture 300" also includes the optical waveguide 320 extending inside the fixture body 312 at the optical output 309.

The collimating lens 314 (e.g., a ball lens) and the focal lens 316 provide a coupling system capable of coupling laser light 302 of enough power into the optical waveguide 320 to obtain the wavelength measurements while also measuring optical power. The use of a germanium-based photodetector, as described below, and a multimode optical fiber as the optical waveguide 320 also help to provide a power level sufficient for the wavelength measurements. In one example, a dual testing system and testing fixture, as described herein, may be capable of a peak power level of at least about −20 dBm at 30 mA for a 1310 nm DFB laser diode, thereby providing a minimum of 0.1% (−30 dB) overall coupling efficiency and enough coupling power for at least the SMSR measurement. In this example, the collimating lens 314 passes about 80% of the laser light (i.e., about −1 dB loss), the photodetector 310 reflects about 8-10% of the laser light (i.e., about −12 dB loss), the focal lens 316 passes about 80% of the laser light (i.e., about −1 dB loss), and about 10% of the reflected and focused laser light (i.e., about −10 dB loss) is coupled into the optical waveguide 320. For a laser diode with an output power of 10 mW (i.e., 10 dBm) this should produce a final coupling power of 25 μW (i.e., −14 dBm), which is sufficient to measure the spectrum performance of the laser including SMSR.

Figure 6A:
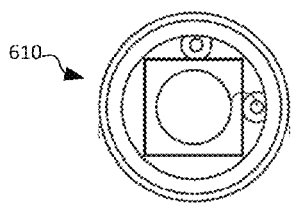
FIG. 6A is a top view of an embodiment of a photodetector for use in a testing fixture, consistent with embodiments of the present disclosure.
Figure 6B:
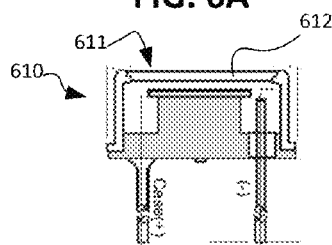
FIG. 6B is a side cross-sectional view of the photodetector shown in FIG. 6A.
Figure 7A:
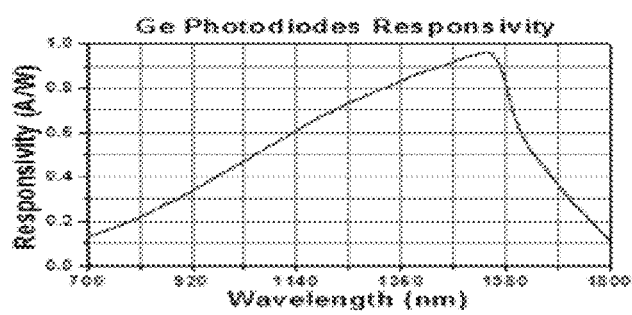
FIGS. 7A-7C are diagrams illustrating optical characteristics of the photodetector shown in FIGS. 6A and 6B.
Figure 7B:
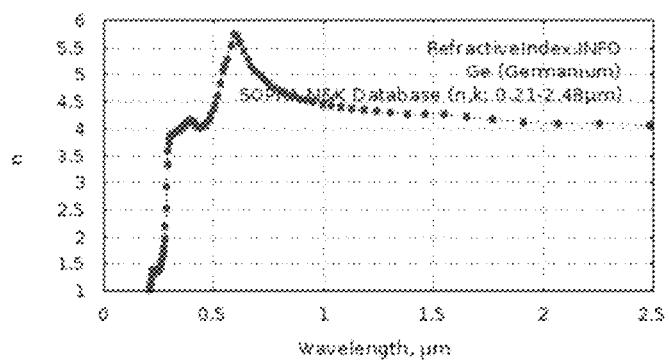
Figure 7C:
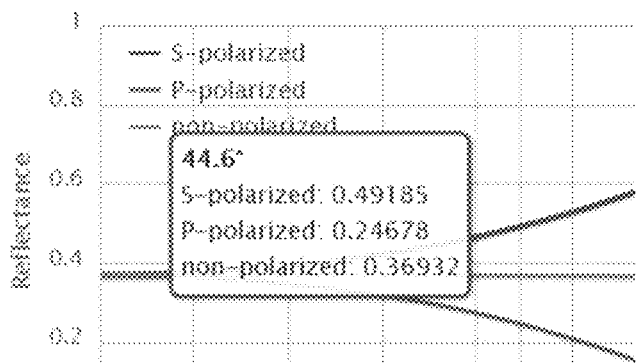

FIGS. 6A and 6B illustrate one example of a photodetector 610 for use in the dual testing systems and testing fixtures described above. This example of the photodetector 610 is a germanium-based photodetector with a size of about 10×10 mm. At a 45° angle of incidence, the photodetector 610 reflects 10-20% of the laser light, and more particularly, about 10% when an AR coating is used. One example of the photodetector 610 is the 8SP package available from Teledyne Judson Technologies. As shown in FIG. 6B, the photodetector package includes a window 612, which provides a light receiving surface 611, and the photodetector 610 is behind the window 612. FIGS. 7A-7C illustrate the optical characteristics of this example of the photodetector 610. In other embodiments, the photodetector may include an InGaAs-based photodetector or a silicon-based photodetector.

Although the dual testing system and testing fixtures are described and shown for testing one laser diode at a time, other embodiments may be designed for simultaneously testing multiple laser diodes at a time. These embodiments of the dual testing system and testing fixtures may include multiple photodetectors and optical coupling systems as described above.

Accordingly, the dual testing system, method and fixture, consistent with embodiments described herein, may be used to perform both optical power measurements and wavelength measurements, thereby allowing a plurality of laser diodes to be tested more efficiently and quickly.

Consistent with an embodiment, a testing fixture is provided for testing laser diodes. The testing fixture includes a fixture body defining an optical path extending from an optical input to an optical output and a collimating lens supported by the fixture body proximate the optical input. The collimating lens is configured to collimate laser light received at the optical input and to direct the collimated laser light along the optical path. A photodetector is supported by the fixture body at a location along the optical path such that the photodetector receives the collimated laser light. The photodetector is configured to detect the collimated laser light for performing a first test and to reflect the collimated laser light along the optical path toward the optical output. A focal lens is supported by the fixture body along the optical path after the photodetector and configured to focus the reflected collimated laser light toward the optical output for performing a second test.

Consistent with another embodiment, a system is provided for performing both optical power and wavelength measurements on laser light emitted from a laser diode. The system includes a photodetector for receiving laser light being tested from a laser diode. The photodetector is configured both to detect the light being tested and to reflect the light being tested along an optical path. The system also includes an optical power testing module electrically connected to the photodetector to perform optical power measurements of the laser light detected by the photodetector and an optical waveguide for receiving the laser light reflected from the photodetector. The system further includes a wavelength testing module optically coupled to the optical waveguide for performing wavelength measurements of the laser light reflected from the photodetector.

Consistent with a further embodiment, a method is provided for performing both optical power and wavelength measurements on laser light emitted from at least one laser diode. The method includes: generating laser light being tested from a laser diode; simultaneously detecting and reflecting the laser light being tested; performing at least one optical power measurement of the detected light; and performing at least one wavelength measurement of the reflected light.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A testing fixture for testing laser diodes, the testing fixture comprising:
    a fixture body defining an optical path extending from an optical input to an optical output;
    a collimating lens supported by the fixture body proximate the optical input, the collimating lens configured to collimate laser light received at the optical input and to direct the collimated laser light along the optical path;
    a photodetector package supported by the fixture body at a location along the optical path such that the photodetector package receives the collimated laser light, the photodetector package including a light receiving surface and a photodetector behind the light receiving surface, wherein the photodetector package is configured to pass a portion of the collimated laser light through a location on the light receiving surface to the photodetector for detection and performing a first test and to reflect another portion of the collimated laser light from the same location on the light receiving surface and along the optical path toward the optical output; and
    a focal lens supported by the fixture body along the optical path after the photodetector and configured to focus the reflected collimated laser light toward the optical output for performing a second test.

2. The testing fixture of claim 1, further comprising an optical waveguide supported by the fixture body proximate the optical output such that the optical waveguide receives the focused laser light, wherein the optical waveguide is configured to carry the laser light for performing the second test.

3. The testing fixture of claim 1, wherein the photodetector is a germanium-based photodetector.

4. The testing fixture of claim 1 wherein the collimating lens includes a ball lens.

5. The testing fixture of claim 1, further comprising a device under test (DUT) support including a plurality of device support regions configured to support a plurality of laser diodes, wherein the DUT support is configured to be positioned relative to the fixture body such that at least one of the device support regions aligns with the optical input.

6. The testing fixture of claim 5, wherein the DUT support is configured to move relative to the fixture body such that the device support regions are successively aligned with the optical input.

7. The testing fixture of claim 1, wherein the photodetector package is supported by the fixture body with the light receiving surface of the photodetector package forming an acute angle of incidence relative to the optical path.

8. The testing fixture of claim 7, wherein the acute angle of incidence is 45°.

9. The testing fixture of claim 2, wherein the optical waveguide includes an optical fiber.

10. The testing fixture of claim 9, wherein the optical fiber is a multimode optical fiber.

11. The testing fixture of claim 1 wherein the photodetector package includes a window providing the light receiving surface and the photodetector behind the window.

12. A system for performing both optical power and wavelength measurements on laser light emitted from a laser diode, the system comprising:
    at least one photodetector package for receiving laser light being tested from at least one laser diode, the photodetector package including a light receiving surface and a photodetector behind the light receiving surface, wherein the photodetector package is configured to pass the light being tested through a location on the light receiving surface for detection and to reflect the light being tested from the same location on the light receiving surface and along an optical path;
    an optical power testing module electrically connected to the photodetector to perform optical power measurements of the laser light detected by the photodetector;
    at least one optical waveguide for receiving the laser light reflected from the photodetector; and
    an optical spectrum analyzer (OSA) optically coupled to the optical waveguide for performing wavelength measurements of the laser light reflected from the photodetector.

13. The system of claim 12, wherein the optical power testing module is a light-current-voltage (LIV) testing module.

14. The system of claim 12, further comprising a testing fixture supporting the photodetector package such that the light receiving surface of the photodetector package forms an acute angle of incidence relative to the optical path.

15. The system of claim 14, wherein the optical waveguide is supported by the testing fixture.

16. The system of claim 12, further comprising a device under test (DUT) support including a plurality of device support regions configured to support a plurality of laser diodes, wherein the DUT support is configured to be positioned relative to the photodetector such that at least one of the device support regions aligns with the photodetector for directing laser light being tested at the photodetector.

17. The system of claim 16, further comprising a driving mechanism for moving the DUT support relative to the photodetector such that the device support regions are successively aligned with the photodetector.

18. A method for performing both optical power and wavelength measurements on laser light emitted from at least one laser diode, the method comprising:
    generating laser light being tested from at least one laser diode;
    passing a portion of the laser light being tested through a location on a light receiving surface and detecting the portion laser light being tested using a photodetector; wherein a photodetector package includes the light receiving surface and the photodetector behind the light receiving surface;
    reflecting another portion of the laser light being tested from the same location on the light receiving surface;
    performing at least one optical power measurement of the detected light; and
    performing at least one wavelength measure of the reflected light.

19. The method of claim 18, further comprising collimating the laser light being tested before detecting and reflecting.

20. The method of claim 18, further comprising focusing the reflected laser light before performing wavelength measurements.

21. The method of claim 18, wherein the at least one optical power measurement includes a light-current-voltage (LIV) measurement.

22. The method of claim 18, wherein the at least one wavelength measurement includes a side-mode suppression ratio (SMSR) measurement.

23. The method of claim 18, wherein the laser diode is a chip-on-submount (COS) laser diode.

24. The method of claim 18, wherein the laser diode is one of a plurality of laser diodes in a bar laser.

25. The method of claim 18, further comprising:
supporting a plurality of laser diodes; and
moving the plurality of laser diodes to successively align respective ones of the plurality of laser diodes for testing by performing the optical power measurement and the wavelength measurement.

\* \* \* \* \*